(12) United States Patent
Tachibana et al.

(10) Patent No.: US 12,501,712 B2
(45) Date of Patent: Dec. 16, 2025

(54) METHOD OF FORMING GROOVES AND VERTICAL CRACKS IN A WAFER COMPRISING INDIVIDUAL SEMICONDUCTOR ELEMENTS TO SEPARATE THE SEMICONDUCTOR ELEMENTS BY CLEAVING THE WAFER ALONG THE GROOVES AND THE VERTICAL CRACKS

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Fumihito Tachibana, Nisshin (JP); Masashi Uecha, Nisshin (JP); Yuji Nagumo, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 421 days.

(21) Appl. No.: 18/158,612

(22) Filed: Jan. 24, 2023

(65) Prior Publication Data

US 2023/0268230 A1 Aug. 24, 2023

(30) Foreign Application Priority Data

Feb. 24, 2022 (JP) ................................. 2022-027109

(51) Int. Cl.
*H01L 21/304* (2006.01)
*H01L 21/02* (2006.01)
(Continued)

(52) U.S. Cl.
CPC ..... *H10D 89/013* (2025.01); *H01L 21/02164* (2013.01); *H01L 21/304* (2013.01); *H01L 21/3065* (2013.01); *H01L 21/56* (2013.01)

(58) Field of Classification Search
CPC ............ H10D 89/013; H01L 21/02164; H01L 21/304; H01L 21/3065; H01L 21/56;
(Continued)

(56) References Cited

U.S. PATENT DOCUMENTS

2007/0089304 A1* 4/2007 Loomis .................. B28D 1/225
33/549
2014/0017837 A1* 1/2014 Kim ........................ H01L 24/97
438/33
(Continued)

FOREIGN PATENT DOCUMENTS

JP H11233459 A * 8/1999
JP 2000252266 A * 9/2000
(Continued)

OTHER PUBLICATIONS

Translation of Kikuo (JP 2000252266 A) (Year: 2000).*
(Continued)

*Primary Examiner* — William B Partridge
*Assistant Examiner* — Ilker Ozden
(74) *Attorney, Agent, or Firm* — Posz Law Group, PLC

(57) ABSTRACT

In a manufacturing method of a semiconductor device, a wafer in which multiple semiconductor elements is formed and having a first surface and a second surface opposite to each other is prepared, and a groove is formed on the first surface of the wafer along a boundary between adjacent semiconductor elements in the multiple semiconductor elements. The wafer is attached to a support plate in such a manner that the first surface of the wafer faces the support plate, and a scribing blade is pressed against the second
(Continued)

surface of the wafer along the boundary to form a vertical crack inside the wafer along the boundary. Then, a breaking blade is pressed against the wafer along the boundary to cleave the wafer along the boundary.

6 Claims, 4 Drawing Sheets

(51) Int. Cl.
*H01L 21/3065* (2006.01)
*H01L 21/56* (2006.01)
*H10D 89/00* (2025.01)

(58) Field of Classification Search
CPC ....... H01L 21/6835; H01L 2221/68327; H01L 2221/6834; H01L 21/78; H01L 21/3043; B28D 5/022
See application file for complete search history.

(56) References Cited

U.S. PATENT DOCUMENTS

| | | | |
|---|---|---|---|
| 2017/0183250 A1 | 6/2017 | Soyama | |
| 2020/0361120 A1* | 11/2020 | Murakami | .............. H01L 21/78 |
| 2022/0102216 A1* | 3/2022 | Furuta | ............... H01L 21/67132 |

FOREIGN PATENT DOCUMENTS

| | | | | |
|---|---|---|---|---|
| JP | 2004-158662 A | | 6/2004 | |
| JP | 2013-089622 A | | 5/2013 | |
| JP | 2015191999 A | * | 11/2015 | |
| TW | 201412483 A | * | 4/2014 | ............. H01L 21/76 |
| TW | 201603981 A | | 2/2016 | |

OTHER PUBLICATIONS

Translation of Takeda (JP 2015191999 A) (Year: 2015).*
Translation of Katayama (Jp H11233459 A) (Year: 1999).*
Translation of TW201412483A (Takeda) (Year: 2014).*
Translation of JPH11233459A (Katayama) (Year: 1998).*

* cited by examiner

METHOD OF FORMING GROOVES AND VERTICAL CRACKS IN A WAFER COMPRISING INDIVIDUAL SEMICONDUCTOR ELEMENTS TO SEPARATE THE SEMICONDUCTOR ELEMENTS BY CLEAVING THE WAFER ALONG THE GROOVES AND THE VERTICAL CRACKS

CROSS REFERENCE TO RELATED APPLICATION

The present application claims the benefit of priority from Japanese Patent Application No. 2022-027109 filed on Feb. 24, 2022. The entire disclosure of the above application is incorporated herein by reference.

TECHNICAL FIELD

The present disclosure relates to a manufacturing method of a semiconductor device.

BACKGROUND

A manufacturing method of a semiconductor device includes a process of individually cutting out semiconductor elements from a wafer in which multiple semiconductor elements are formed. Conventionally, a wafer has been cut (diced) along a boundary between adjacent semiconductor elements.

SUMMARY

The present disclosure provides a manufacturing method of a semiconductor device. In the manufacturing method, a wafer in which multiple semiconductor elements is formed and having a first surface and a second surface opposite to each other is prepared, and a groove is formed on the first surface of the wafer along a boundary between adjacent semiconductor elements in the multiple semiconductor elements. The wafer is attached to a support plate in such a manner that the first surface of the wafer faces the support plate, and a scribing blade is pressed against the second surface of the wafer along the boundary to form a vertical crack inside the wafer along the boundary. Then, a breaking blade is pressed against the wafer along the boundary to cleave the wafer along the boundary.

BRIEF DESCRIPTION OF DRAWINGS

Objects, features and advantages of the present disclosure will become apparent from the following detailed description made with reference to the accompanying drawings. In the drawings.

DETAILED DESCRIPTION

In a scribing and breaking process, first, a scribing blade (a disk blade with a thin peripheral edge) is pressed along a boundary between adjacent semiconductor elements to generate a crack inside a wafer along the boundary. Since the crack extends in a direction perpendicular to a surface of the wafer, the crack is hereinafter referred to as a vertical crack. Subsequently, a breaking blade is pressed along the boundary to cleave the wafer along the boundary. The scribing and breaking process can reduce a width between the adjacent semiconductor elements in the wafer compared to the conventional dicing process.

In the scribing process, the scribing blade is strongly pressed against the wafer attached to a support plate. Therefore, if foreign matter is present between a rear surface of the wafer and the support plate, the wafer may be sandwiched between the foreign matter and the scribing blade, and the wafer may be strongly pressed very locally and damaged.

In a manufacturing method of a semiconductor device according to an aspect of the present disclosure, a wafer in which multiple semiconductor elements is formed and having a first surface and a second surface opposite to each other is prepared, and a groove is formed on the first surface of the wafer along a boundary between adjacent semiconductor elements in the multiple semiconductor elements. The wafer is attached to a support plate in such a manner that the first surface of the wafer faces the support plate, and a scribing blade is pressed against the second surface of the wafer along the boundary to form a vertical crack inside the wafer along the boundary. Then, a breaking blade is pressed against the wafer along the boundary to cleave the wafer along the boundary.

In the manufacturing method described above, the groove is formed on the first surface that is opposite to the second surface to which the scribing blade is pressed. During scribing, even if foreign matter enters directly under the boundary between the adjacent semiconductor elements, the foreign matter enters the groove. Thus, the wafer is not strongly sandwiched between the scribing blade and the foreign matter. Even if foreign matter enters between the wafer and the support plate, the wafer is not damaged in the scribing process (at least damage is reduced).

The groove described above may be formed by a process of forming a structure for realizing a function as the semiconductor elements. For example, the groove may be formed by a process of forming a trench by etching in a region where the semiconductor elements are to be formed. A silicon oxide film may be formed on an inner surface of the groove, and the silicon oxide film may be formed in a process of forming the silicon oxide film on the semiconductor elements. The groove may be formed in a process of forming a resin layer on the semiconductor elements.

Figure 1:
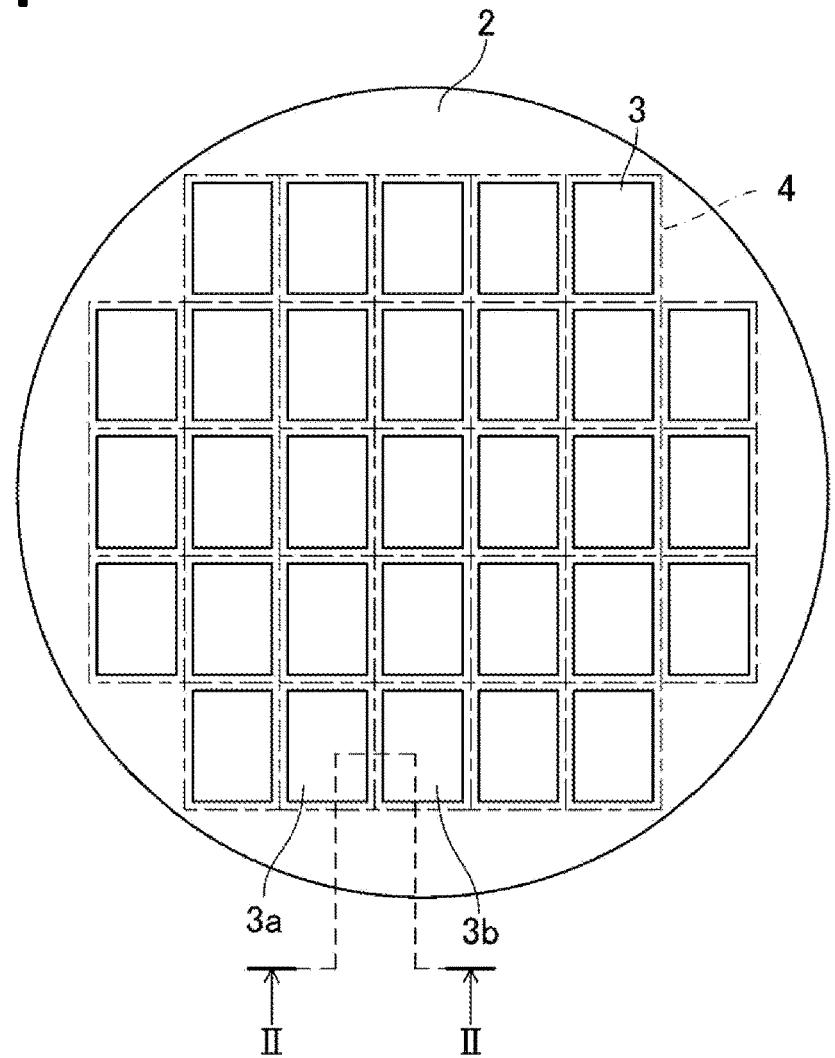
FIG. 1 is a plan view of a wafer.

A manufacturing method of an embodiment will be described with reference to the drawings. FIG. 1 is a plan view of a wafer 2 in which multiple semiconductor elements 3 are formed in a grid pattern. In FIG. 1, the semiconductor element 3 is schematically represented by a solid-line rectangle. The reference numeral "3" has been omitted for some solid-line rectangles. For convenience of explanation, a dividing line which is a boundary between adjacent semiconductor elements 3 and which is used when dividing the wafer 2 into individual semiconductor elements 3 later is referred to as a scribe line 4. In FIG. 1, the scribe line 4 is indicated by alternate long and short dash lines. Each semiconductor element 3 separated from the wafer 2 corresponds to a semiconductor device. The semiconductor elements 3 are elements having functions such as a transistor and a diode.

The material of the wafer 2 may be a semiconductor material such as SiC or GaN, but is preferably a semiconductor material in which a crystal plane is formed. The wafer 2 is formed such that the crystal plane is perpendicular to a surface of the wafer 2. The semiconductor elements 3 are formed such that the scribe line 4 (that is, the boundary between the adjacent semiconductor elements 3) coincides with the crystal plane in plan view of the wafer.

The manufacturing method of the semiconductor device (that is, the semiconductor element 3) will be described with reference to FIG. 2 to FIG. 8 that illustrate a cross section taken along line II-II of FIG. 1. For convenience of explanation, among the semiconductor elements 3, a semiconductor element on the left side of line II-II in FIG. 1 is denoted by a reference numeral 3a, and a semiconductor element located on the right side of line II in FIG. 1 is denoted by a reference numeral 3b. The manufacturing method of the present embodiment includes a groove forming process, a scribing process, and a breaking process.

(Groove Forming Process)

The groove forming process will be described with reference to FIG. 2 to FIG. 5. The wafer 2 has a first surface 2a and a second surface 2b opposite to each other. In a surface portion of the first surface 2a, main structures of the semiconductor elements 3a and 3b such as gate electrodes and channels are formed.

Figure 2:
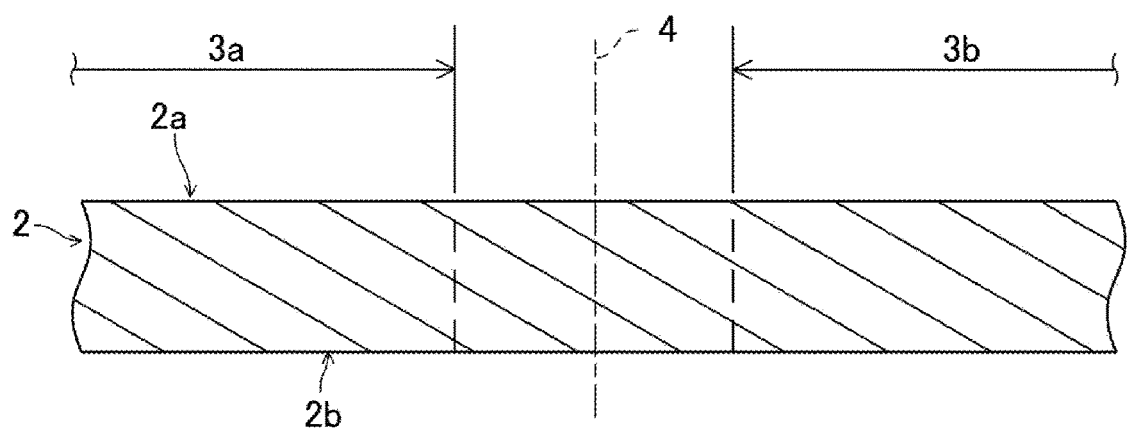
FIG. 2 is a diagram illustrating a part of a groove forming process.

In the cross section of the wafer 2 in FIG. 2, a region on a left side of a left broken line is the semiconductor element 3a, and a region on a right side of a right broken line is the semiconductor element 3b. The main structures such as the channels and the gate electrodes formed in the semiconductor elements 3a and 3b (that is, main structures among the structures necessary for realizing the functions of the semiconductor elements 3) are not shown. The scribe line 4 described above is positioned between the semiconductor element 3a and the semiconductor element 3b. The scribe line 4 is indicated by an alternate long and short dash line in FIG. 2 and subsequent drawings.

Figure 3:
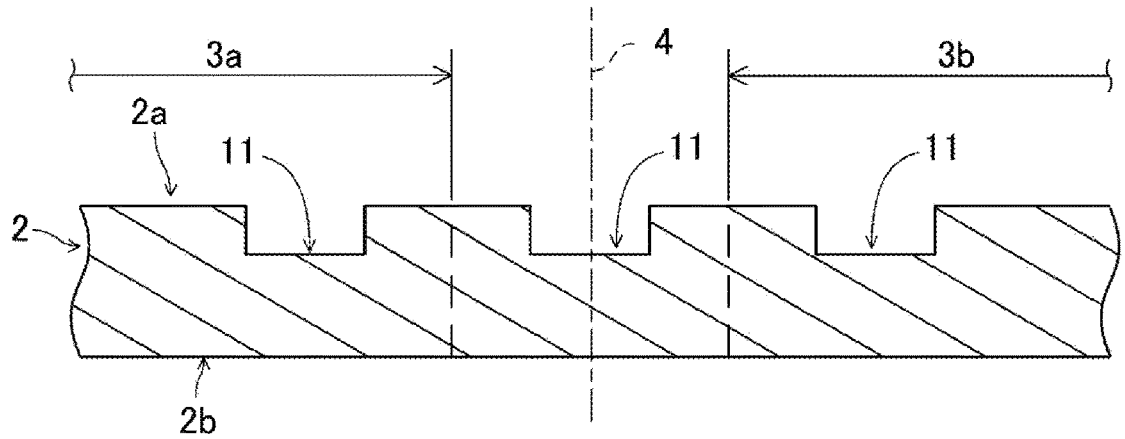
FIG. 3 is a diagram illustrating a part of the groove forming process subsequent to the part illustrated in FIG. 2.

In the groove forming process, a groove 11 is formed along the boundary (that is, the scribe lines 4) between the adjacent semiconductor elements 3a and 3b in the first surface 2a of the wafer 2 in which the semiconductor elements 3 are formed. FIG. 2 shows the cross section of the wafer 2 before forming the groove 11. A process such as dry etching is performed on the first surface 2a of the wafer 2 to form the groove 11 along the scribe line 4 (FIG. 3). The dry etching process for forming the groove 11 may be one of processes for forming structures (for example, trenches) for realizing the functions as semiconductor elements 3 in the regions of the semiconductor elements 3a and 3b. Therefore, grooves 11 are also formed in the regions of the semiconductor elements 3a and 3b.

Figure 4:
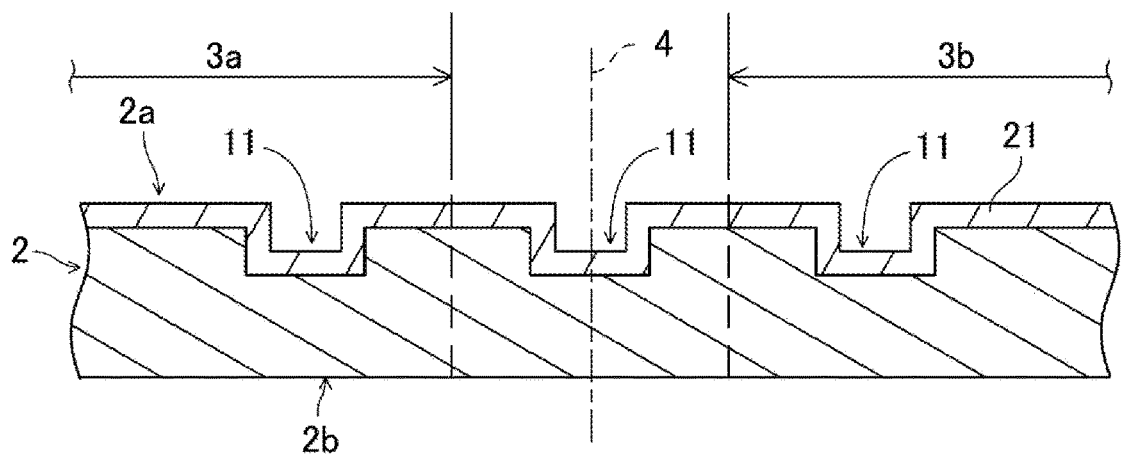
FIG. 4 is a diagram illustrating a part of the groove forming process subsequent to the part illustrated in FIG. 3.

Next, a silicon oxide film 21 is formed on the first surface 2a (FIG. 4). Since the silicon oxide film 21 also has one of the functions of the semiconductor elements 3a and 3b, the silicon oxide film 21 is also formed on the semiconductor elements 3a and 3b. The silicon oxide film 21 in the regions of the semiconductor elements 3a and 3b is provided to insulate surface layers of the semiconductor elements 3a and 3b. The silicon oxide film 21 is also formed on inner surfaces and bottom surfaces of the grooves 11.

Figure 5:
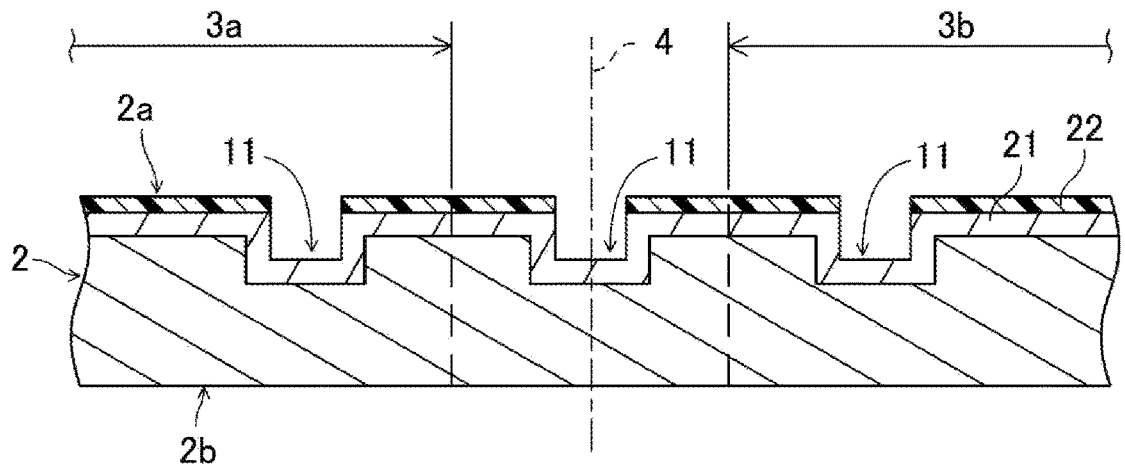
FIG. 5 is a diagram illustrating a part of the groove forming process subsequent to the part illustrated in FIG. 4.

Next, a resin layer 22 is formed on the silicon oxide film 21 (FIG. 5). Since the resin layer 22 has a function of protecting the surfaces of the semiconductor elements 3a and 3b, the resin layer 22 is also formed on the semiconductor elements 3a and 3b. However, the resin layer 22 is formed only outside the grooves 11. The resin layer 22 is, for example, a polyimide or polyamide layer.

The groove 11 formed close to the first surface 2a of the wafer 2 has a width of approximately 10 to 100 microns and a depth of approximately 5 to 50 microns. The bottom surface of the groove 11 is flat.

The silicon oxide film 21 and the resin layer 22 may be formed by the processes of forming the structures for realizing the functions as the semiconductor elements 3. As described above, the silicon oxide film 21 is formed on the inner surface of the groove 11. This silicon oxide film 21 may be formed in a process of forming the silicon oxide film on the semiconductor elements 3a and 3b. The groove 11 is increased in depth by the resin layer 22, and the resin layer 22 may be formed in the process of forming the resin layer on the semiconductor elements 3a and 3b.

(Scribing Process)

The scribing process is performed subsequent to the groove forming process. The scribing process will be described with reference to FIG. 6. In the scribing process, the wafer 2 is attached to a support plate 31 in such a manner that the first surface 2a faces the support plate 31. A scribing blade 33 is pressed against the second surface 2b of the wafer 2 along the scribe line 4 to form a vertical crack 5 inside the wafer 2 along the scribe line 4.

A fixing sheet 32 is sandwiched between the wafer 2 and the support plate 31. The fixing sheet 32 is sandwiched to restrict the wafer 2 from moving when the scribing blade 33 is moved along the scribe line 4.

The scribing blade 33 is a disc-shaped component and is pivotally supported by a support apparatus (not shown). The scribing blade 33 is moved along the scribe line 4 while being pressed against the wafer 2. During movement, the scribing blade 33 rolls on the wafer 2 without slipping like a tire rolling on a road surface. Although the scribing blade 33 has a sharp peripheral edge, the scribing blade 33 does not cut the wafer 2 and is only pressed against the second surface 2b of the wafer 2. As described above, the scribe line 4 runs along the crystal plane of the wafer 2, and when the scribing blade 33 is strongly pressed against the wafer 2, the vertical crack 5 is generated inside the wafer 2 along the scribe line 4. The "vertical crack" means a crack extending perpendicularly to the surfaces 2a, 2b of the wafer 2. In other words, the vertical crack 5 extends along the crystal plane of the wafer 2.

Figure 6:
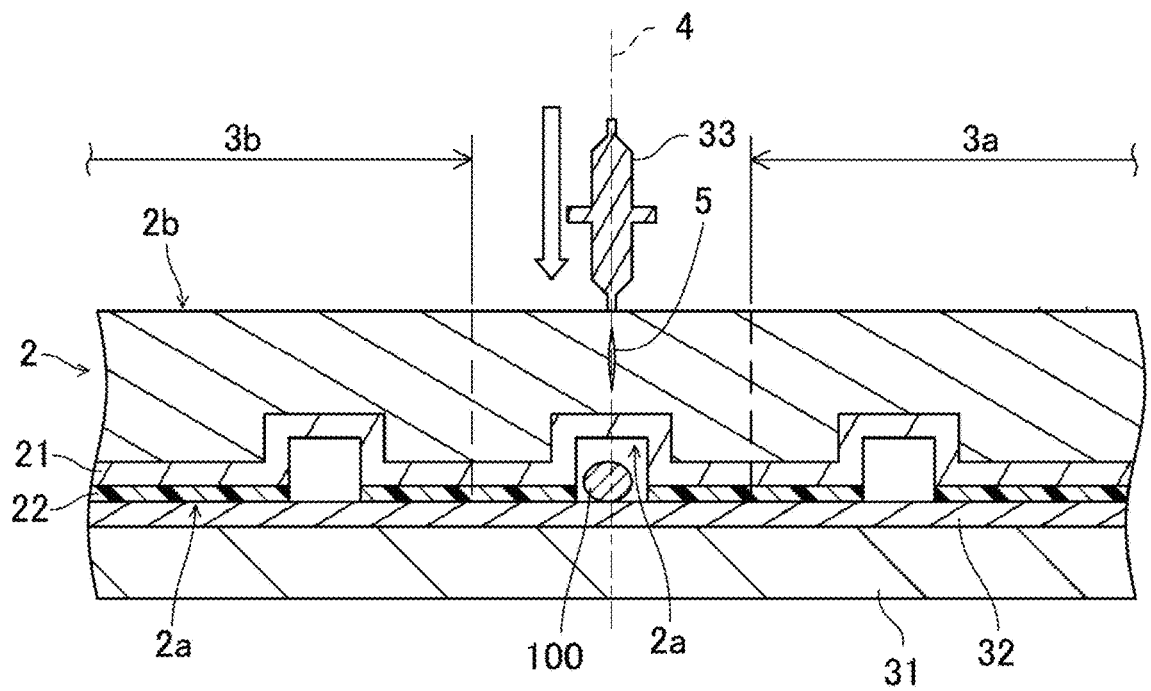
FIG. 6 is a diagram illustrating a scribing process.

When attaching the wafer 2 to the support plate 31 with the fixing sheet 32, there is a possibility that a foreign matter 100 such as dust may be caught between the wafer 2 and the support plate 31 (fixing sheet 32). If the scribing blade 33 is strongly pressed against the wafer 2 while the foreign matter 100 is sandwiched therebetween, an extremely strong stress is locally concentrated on the wafer 2 between the foreign matter 100 and the scribing blade 33, and the wafer 2 may be damaged. However, in the manufacturing method of the present embodiment, the groove 11 is formed along the scribe line 4 on the first surface 2a of the wafer 2 facing the support plate 31. Thus, as shown in FIG. 6, the foreign object 100 enters the groove 11. Therefore, the wafer 2 is not strongly sandwiched between the scribing blade 33 and the foreign matter 100, and the wafer 2 can be restricted from being seriously damaged.

The flatness of the bottom surface of the groove 11 also contributes to the reduction of damage to the wafer 2. Since the bottom surface of the groove 11 is flat, the wafer 2 is not strongly sandwiched between the foreign matter 100 that has entered and the scribing blade 33. Thus, the wafer 2 can be restricted from being seriously damaged. When a groove is V-shaped, the bottom of the groove has an acute angle. Therefore, if foreign matter comes into contact with the bottom of the groove when the scribing plate 33 is pressed, a new crack may occur from the bottom of the V-shaped groove.

(Breaking Process)

Figure 7:
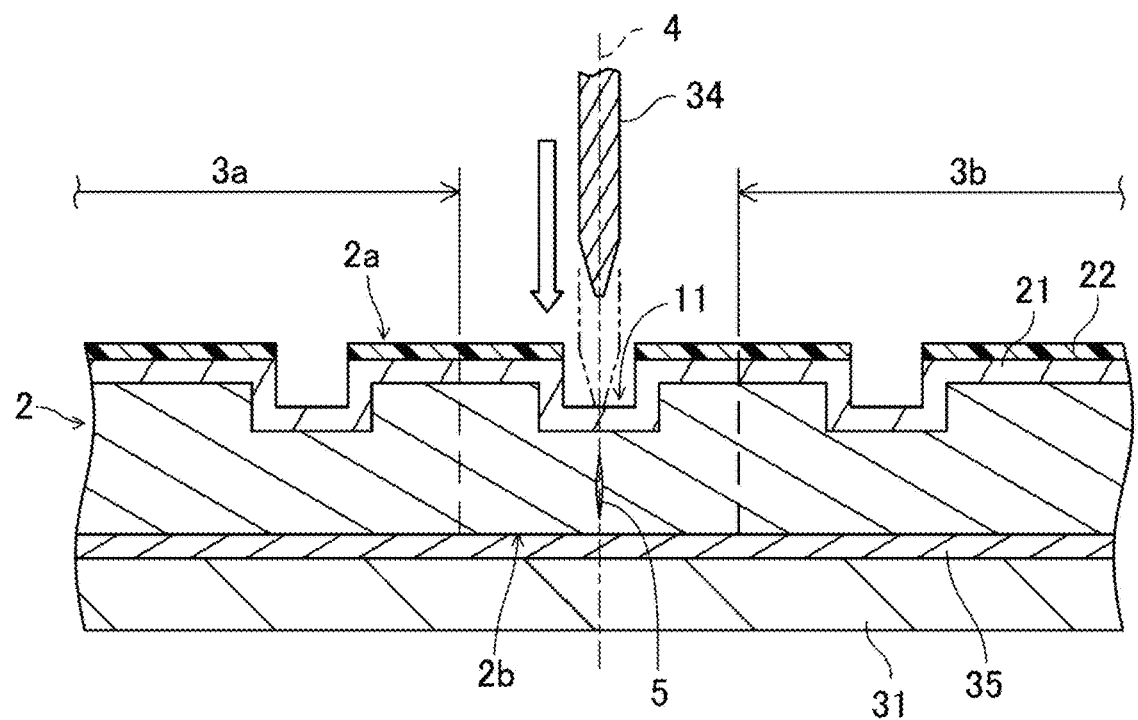
FIG. 7 is a diagram illustrating a part of a breaking process.
Figure 8:
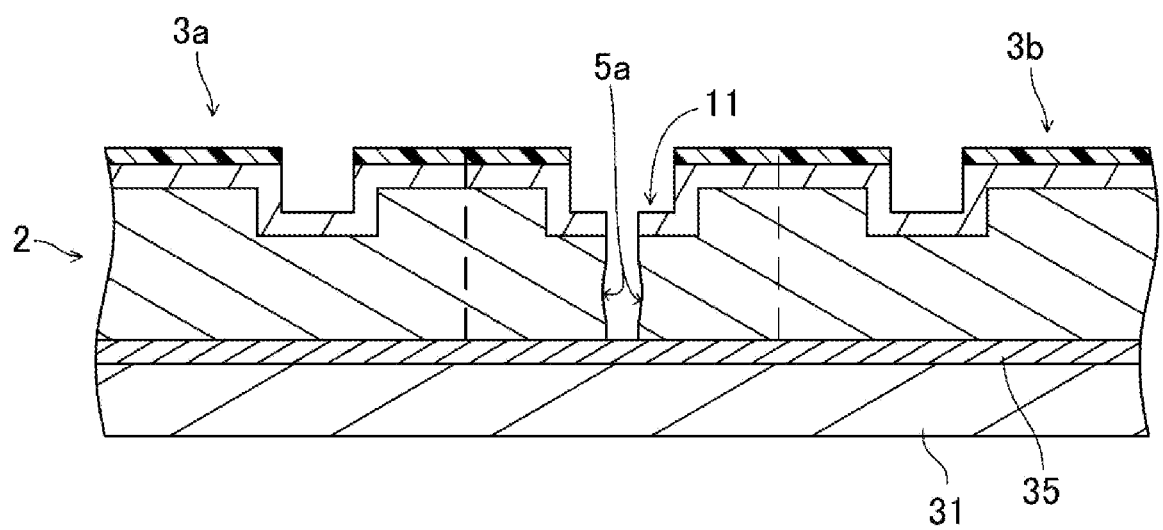
FIG. 8 is a diagram illustrating a part of the breaking process subsequent to the part illustrated in FIG. 7.

The breaking process is performed subsequent to the scribing process. The breaking process will be described with reference to FIG. 7 and FIG. 8. In the breaking process, a breaking blade 34 is pressed along the scribe line 4 to cleave the wafer 2 along the scribe line 4. FIG. 7 shows a cross section before the breaking blade 34 is pressed. The breaking blade 34 pressed against the wafer 2 is drawn by an imaginary line (alternate long and two short dash line). FIG. 8 shows a cross section of the wafer 2 cleaved along the scribe line 4 after the breaking blade 34 is pressed and divided into a region close to the semiconductor element 3a and a region close to the semiconductor element 3b.

The breaking blade 34 has a length equivalent to a diameter of the wafer 2 and is pressed against the wafer 2 over the entire length of the scribe line 4. The vertical crack 5 is formed along the scribe line 4 inside the wafer 2. When the breaking blade 34 is strongly pressed against the wafer 2, the vertical crack 5 spreads further and the wafer 2 is cleaved along the scribe line 4 (see FIG. 8). In FIG. 8, a trace of the vertical crack 5 is denoted by reference numeral "5a".

Note that the breaking blade 34 is pressed against the second surface 2b of the wafer 2. In other words, the breaking blade 34 is pressed against the bottom surface of the groove 11.

In the breaking process, the wafer 2 is temporarily removed from the support plate 31 and is attached with the second surface 2b facing the support plate 31. At this time, another fixing sheet 35 is sandwiched between the wafer 2 and the support plate 31 (see FIG. 7 and FIG. 8). The fixing sheet 35 is employed to restrict the wafer 2 from slipping off the support plate 31 when the breaking blade 34 is pressed against the wafer 2.

As described above, according to the manufacturing method of the present embodiment, the groove 11 is formed to the first surface 2a of the wafer 2 along the scribe line 4, and the scribing blade 33 is pressed against the wafer 2 in a state where the first surface 2a to which the groove 11 is formed faces the support plate 31. By introducing the groove 11, when the scribing blade 33 is strongly pressed against the wafer 2, damage caused by the foreign matter 100 does not occur (at least damage to the wafer 2 is reduced).

Note that neither the scribing blade 33 nor the breaking blade 34 cuts the wafer 2. The scribing blade 33 creates the vertical crack 5 inside the wafer 2 and the breaking blade 34 cleaves the wafer 2.

At least one or both of the silicon oxide film 21 and the resin layer 22 may be omitted. However, the process of forming the groove 11, the process of forming the silicon oxide film 21, and the process of forming the resin layer 22 are all necessary processes for manufacturing the semiconductor element 3 (processes for manufacturing the structures for realizing the functions as the semiconductor elements 3). Therefore, adding the process of forming the groove 11 along the scribe line 4 and the process of forming the silicon oxide film 21 and the resin layer 22 to the conventional manufacturing method only requires a slight increase in cost.

The points to be noted regarding the technique of the present embodiment will be described. In the manufacturing method of the present embodiment, the breaking blade 34 is pressed against the first surface 2a in the breaking process. The breaking blade 34 may be pressed against the second surface 2b. The scribing blade 33 and the breaking blade 34 may be made of any material and may have any shape as long as they realize the functions described above.

Since the foreign matter 100 that has entered the groove 11 is captured by the fixing sheet 32 having adhesiveness, the foreign matter 100 is removed from the wafer 2 together with the fixing sheet 32 when the fixing sheet 32 is peeled off from the wafer 2.

The vertical crack 5 may reach one of the first surface 2a and the second surface 2b of the wafer 2.

Although specific examples of the present disclosure have been described in detail above, these are merely examples and do not limit the scope of claims. The techniques described in the present description include various modifications of the specific examples illustrated above. The technical elements described in the present description or the drawings exhibit technical usefulness alone or in various combinations, and are not limited to the combinations described in the present description at the time of filing. In addition, the techniques illustrated in the present specification or drawings can achieve multiple purposes at the same time, and achieving one of the purposes itself has technical usefulness.

What is claimed is:

1. A manufacturing method of a semiconductor device, comprising:
   preparing a wafer in which a plurality of semiconductor elements is formed and having a first surface and a second surface opposite to each other, and forming a groove on the first surface of the wafer along a boundary between adjacent semiconductor elements in the plurality of semiconductor elements;
   attaching the wafer to a support plate with a fixing sheet having adhesiveness sandwiched between the wafer and the support plate in such a manner that the first surface of the wafer faces the support plate, and pressing a scribing blade against the second surface of the wafer along the boundary to form a vertical crack inside the wafer along the boundary; and
   after peeling off the fixing sheet from the wafer, pressing a breaking blade against the wafer along the boundary to cleave the wafer along the boundary.

2. The manufacturing method according to claim 1, wherein
   the forming the groove is performed in a process of forming a structure for realizing a function as the plurality of semiconductor elements.

3. The manufacturing method according to claim 2, wherein
   the forming the groove is performed in a process of forming a trench by etching in a region where the plurality of semiconductor elements is formed.

4. The manufacturing method according to claim 2, further comprising
   forming a silicon oxide film on an inner surface of the groove in a process of forming the silicon oxide film on the plurality of semiconductor elements.

5. The manufacturing method according to claim 2, wherein the forming the groove is performed in a process of forming a resin layer on the plurality of semiconductor elements.

6. The manufacturing method according to claim 1, wherein
the pressing the breaking blade against the wafer is performed with another fixing sheet sandwiched between the wafer and the support plate.

\* \* \* \* \*